United States Patent [19]

Matsuzaki et al.

[11] Patent Number: 5,091,883
[45] Date of Patent: Feb. 25, 1992

[54] SEMICONDUCTOR MEMORY AND MICROPROCESSOR

[75] Inventors: Nozomu Matsuzaki; Takashi Akioka; Masahiro Iwamura, all of Hitachi; Atushi Hiraishi, Oume; Tatsumi Yamauchi; Yuji Yokoyama, both of Hitachi; Yutaka Kobayashi, Katsuta; Hideaki Uchida, Takasaki, all of Japan

[73] Assignee: Hitachi, Ltd., Tokyo, Japan

[21] Appl. No.: 552,100

[22] Filed: Jul. 13, 1990

[30] Foreign Application Priority Data

Jul. 14, 1989 [JP] Japan .................. 1-181827

[51] Int. Cl.$^5$ ............................. G11C 13/00
[52] U.S. Cl. .................. 365/189.05; 365/51
[58] Field of Search ............ 365/51, 189.01, 189.05

[56] References Cited

U.S. PATENT DOCUMENTS 4,954,987 9/1990 Auvinen et al. .......... 365/189.05

Primary Examiner—Terrell W. Fears
Attorney, Agent, or Firm—Antonelli, Terry, Stout & Kraus

[57] ABSTRACT

An input buffer for processing an external signal is provided in one of passways, which is the most closest to a line for equally dividing the whole of a plurality of memory cell blocks longitudinally or laterally into two sections, the passway interposing between the adjacent memory cell blocks of the plurality of memory cell blocks to which a processed signal of the input buffer is transmitted, whereby the length of the signal pass from the input buffer to each memory cell of the memory cell blocks can be shortened. Therefore, since the memory cell or a logic element existing between the input buffer and the memory cell is operated by a pulse of little distortion without delay of time, a access time can be reduced and a processing speed of a microprocessor can be increased. Further, a degree of freedom in designing a system of a memory or the microprocessor is further improved.

9 Claims, 9 Drawing Sheets

SEMICONDUCTOR MEMORY AND MICROPROCESSOR

BACKGROUND OF THE INVENTION

1. Field of the Invention

The present invention relates to a semiconductor memory and a microprocessor, and more particularly, to an arrangement of an input buffer or the like suitable for realization of high-speed operation.

2. Description of the Related Art

As one example of a conventional semiconductor memory, there has been known such a conventional one as stated in ISSCC/86, SESSION XVI "STATIC RAMs THPM 16. 3; A 15 ns CMOS 64K RAM".

In the above-mentioned prior art, the semiconductor memory is constituted in such a manner that a plurality of memory cells are divided into a plurality of memory cell blocks (sometimes they are referred to as memory cell mats) and that input buffers for processing external signals which are accessed to these memory cell blocks are disposed along the side of the chip from its corner. Similarly, it may be supposed that in U.S. Pat. No. 4,616,310 or U.S. Pat. No. 4,831,433, the input buffers are located in the region of the side of the chip together with input pads.

Also, an input buffer of a memory such as a RAM or ROM of the conventional microprocessor is arranged to locate around the region where gate arrays including a memory array are formed (Japanese Patent Unexamined Publication Nos. 60-31239, 60-35532, and 62-285443).

On one hand, the semiconductor memory or the microprocessor is more and more required to shorten a period of operation time so as to process the signals at high speed. Therefore, it is important to minimize a memory access time during operation.

According to the prior art, however, since the input buffer is arranged to locate around the edge portion of the chip or the region of the memory array, a length of a wiring for transmitting the signals is sometimes elongated, when a relation in disposition between the input buffer and the memory cells to which the processed signals are transmitted is inappropriate. When the length of the signal pass is extended, a floating electrostatic capacity C and a resistance R of the wiring are increased. As a result, because a rising edge or a falling edge of a signal pulse to be transmitted is distorted so that the inclination of the pulse waveform becomes skew, the memory cell or a logic circuit which detects a signal at a certain threshold level operates after a delay in practice. An external signal including an already skew waveform scarcely causes the above-described delay.

However, waveforms of the external signals which have been processed through the input buffer are shaped so that the risings of the waveforms become steep. Succeedingly, the length of the wiring (amount of load) on the downstream of the input buffer has large influence over a signal transmission delay.

Moreover, as for the semiconductor memory in which input buffers are arrayed around one memory cell block, in the case where a signal has to be transmitted from the input buffers to a memory cell belonging to another memory cell block, there occurs a problem the same as the above that the length of the wiring on the downstream of the input buffer has large influence over a signal transmission delay.

SUMMARY OF THE INVENTION

One object of the present invention is to shorten a period of transmission lag of external signals supplied from input pads within a semiconductor memory to a memory cell so as to access the signals to the semiconductor memory at high speed.

In order to achieve this object, according to the present invention, a semiconductor memory comprises:

a rectangular semiconductor chip;

a plurality of memory cell blocks formed with a plurality of memory cells disposed in alignment within a plurality of rectangular areas on the upper surface of the semiconductor chip, which are arrayed to be disposed in alignment spaced apart from one another with passways being interposed between the adjacent areas;

a plurality of input pads formed in the peripheral region on the upper surface of the semiconductor chip; and at least one input buffer provided on the upper surface of the semiconductor chip, and processing an external signal which is input from one of the input pads, and the processed signal being transmitted to the memory cell in the memory cell block group including at least the two memory cell blocks directly or via a logic circuit:

wherein the input buffer is provided in one of the passways, which is the closest to a line for equally dividing the memory cell block group longitudinally or laterally into two sections, the passway interposing between the adjacent memory cell blocks belonging to the memory cell block group to which the processed signal of the input buffer is transmitted.

Another object of the invention is to shorten a period of transmission lag of signals to be transmitted from a central processing unit of a microprocessor to memory cells within a memory, so as to increase a speed of processing in the microprocessor.

In order to realize the above another object, the present invention provides a microprocessor unit comprising:

a central processing unit and a memory which are formed on the upper surface of a semiconductor chip, The memory including a plurality of memory cell blocks formed with a plurality of memory cells disposed in alignment within a plurality of rectangular areas on the upper surface of the semiconductor chip, which are arrayed to be disposed in alignment part from one another with passways being interposed between the adjacent areas, and at least one input buffer;

the input buffer being adapted to process an external signal which is input from the central processing unit so as to transmit the processed signal to the memory cells of a memory cell block group including at least the two memory cell blocks directly or via a logic circuit:

wherein the input buffer is provided in one of said passways, which is the most closest to a line for equally dividing the memory cell block group longitudinally or laterally into two sections, said passway interposing between the adjacent memory cell blocks belonging to the memory cell block group to which the processed signal of the input buffer is transmitted.

An advantageous point that a memory access time is shortened and that a processing speed of the microprocessor is increased, which is brought by the semiconductor memory or the microprocessor of the present invention, will be described below.

External signals such as address signals, write enable signals, write data, address strobe signals or the like which are input into the memory, are ordinarily processed by the input buffers, and these processed signals are transmitted directly to the memory cells via the wiring or they are further processed through a logic circuit consisting of logic gates such as decoders so as to be transmitted to the memory cells. A time required for transmission of the external signals relies on an operating time of each logic gate and transmission lag by the signal transmission circuit including the wiring. The transmission lag by this transmission circuit depends on a time constant T determined in accordance with a resistance R of the transmission circuit and a floating electrostatic capacity C of the same, and when the time constant T becomes larger, the transmission lag is increased. That is to say, a pulse to be transmitted is distorted according to the above-mentioned time constant T so that a rising edge and a falling edge of the pulse are skewed. Accordingly, an operation of the memory cell or the logic gate which operates at a certain threshold level delays in response to a degree of the inclination of the rising edge or the falling edge of the pulse. As the rising edge or the falling edge of the pulse to be transmitted becomes steeper, it influences the transmission lag. In this connection, since the rising edge and the falling edge of the pulse of the external signal which is input into the input buffer has already been made skewed, the time constant of the wiring within the chip leading to the input buffer has a small influence on the transmission lag of the signal. On the other hand, the waveform of the pulse passing through the input buffer is shaped in such a manner that the rising edge as well as the falling edge thereof are steep. Therefore, an increase of the time constant of the signal transmission circuit on the downstream of the input buffer affects the transmission lag of the signal to a considerable degree.

In view of the above, as mentioned so far, according to the present invention, the input buffer is located in the intermediate area of the memory cell block group in order to shorten the pass length of the wiring from the input buffer to each memory cell, whereby the resistance and the floating electrostatic capacity of the wiring on the downstream of the input buffer are decreased so that the time constant is also reduced in accordance with the decrease of the resistance and the floating capacity. Accordingly, because the pulse including a steep rising edge and falling edge of which waveform is shaped through the input buffer is transmitted with the distortion of the rising edge and the falling edge being reduced, the memory cell or the logic gate which operates at a certain threshold level is to operate after a short time of delay. As a result, the transmission time of the signal from the input pads to the memory cell can be remarkably shortened, thereby making it possible to realize a high-speed memory access. Further, if the input pads are provided in the area adjacent to the input buffer within the edge region of the semiconductor chip, the length of the signal pass from the input pads to the input buffer is reduced, so that the transmission time of the signal can be further shortened.

Such shortening of the transmission time brings a possibility of an increase in the number of stages of the logic gate in the address decoder device, whereby a degree of freedom in designing a system or layout of the address decoder device and the memory cell blocks is increased.

Further, since the input buffer is not provided in the edge region of the semiconductor chip, a degree of freedom in designing a layout of the input pads is increased, the location of the input pads being restricted to the edge region of the chip. In particular, there is a large practical merit when the number of input/output signals is increased because of a large scale of the memory, and is also a possibility of reducing an installation area occupied by the chip.

Preferred embodiments of the invention will be described below in detail with reference to the accompanied drawings.

DETAILED DESCRIPTION OF THE PREFERRED EMBODIMENTS

Figure 1:
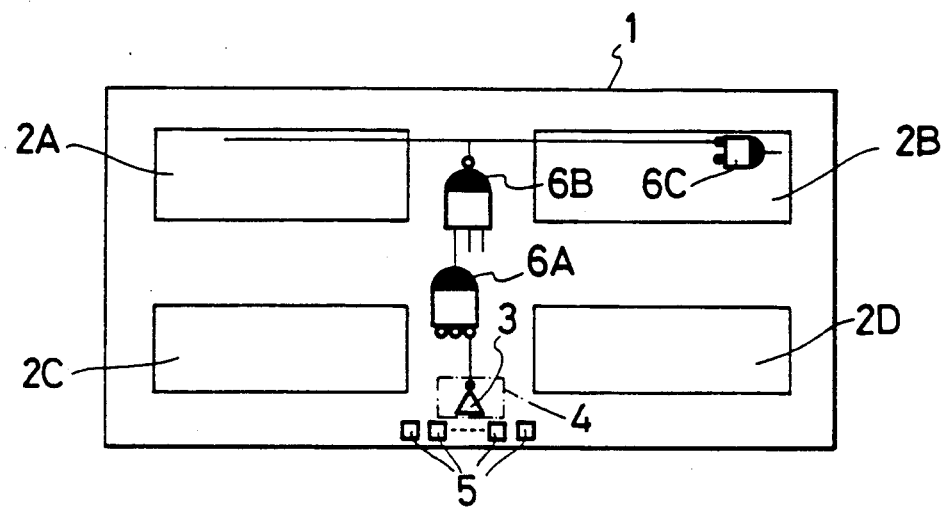
FIG. 1 is an explanatory view showing a disposition of one embodiment of a semiconductor memory according to the present invention.

One preferred embodiment of the present invention which is applied in an SRAM of 256 kilobits is shown in FIG. 1. As illustrated in this figure, a semiconductor memory unit 1 is in a one-chip piece. Referring to FIG. 1, a number of memory cells in each semiconductor memory unit are divided into four memory cell blocks (mats) 2A to 2D which are arranged in alignment spaced apart from one another with passways being interposed between the respective adjacent blocks. The passways provided between the respective neighboring memory cell blocks are adapted to be used for wiring or otherwise forming logic elements. The invention can be applied to a semiconductor memory device including a plurality of chips. For simplifying illustration of the drawings, the four divided-type memory cel is illustrated as a representative. In practice, a larger number of memory cell blocks, for example, 32 memory cell blocks, are used to mount on one memory chip.

At least one input buffer 3 is provided on a location where a group of the memory cell blocks 2A to 2D is longitudinally divided into left and right sections, as viewed in FIG. 1. One or more input buffers are provided to be concentrated in an area 4 of the passway between the memory cell blocks 2C and 2D disposed in symmetrical with respect to a bisector extending longitudinally across the semiconductor memory chip. In the case where the number of the laterally arrayed memory cell blocks is odd, the input buffers are provided in a passway close to the bisector of the semiconductor memory chip. Though the number of the input buffers 3 varies depending on the number of the memory blocks used in the memory device, several to twenty or more is usual. These input buffers are appropriately contained within the area 4 shown in FIG. 1.

Input signals of these input buffers 3 are directly supplied via the wiring from input pads 5 laterally arrayed and disposed along the side edge of the chip.

Figure 2:
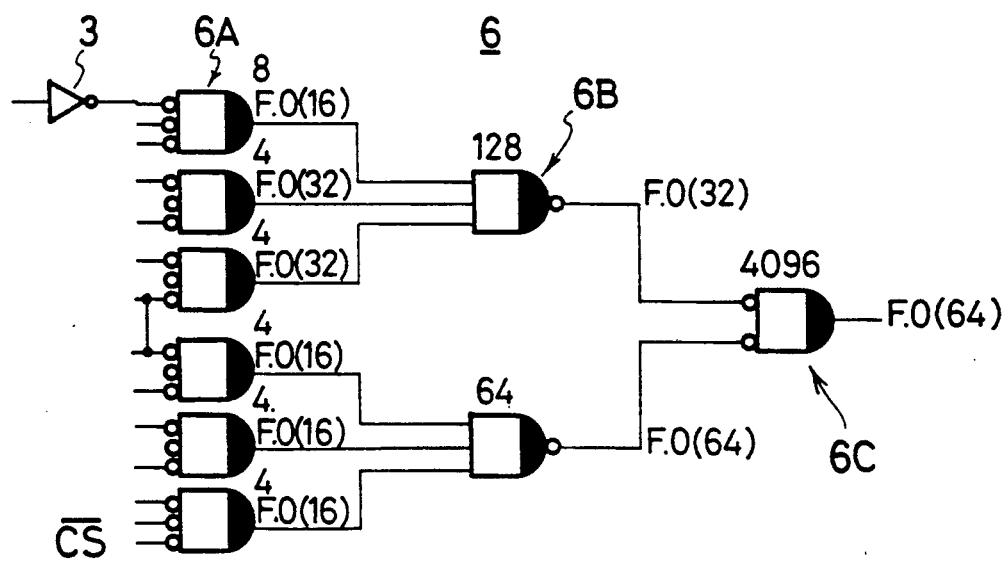
FIG. 2 is a block diagram of a decode circuit of the embodiment in FIG. 1.

Meanwhile, output signals from the input buffers 3 are fed in the memory cells through a decoder device 6 including decoders 6A to 6C. The decoder device 6 of the three-staged type comprises a logical constitution explanatorily illustrated in FIG. 2. In order to facilitate understanding of the invention, one of signal passes in a main word line whose period of delay time is the longest is represented. Referring to FIG. 2, this signal pass is drafted by a heavy line. The decoder device 6 shown in FIG. 2 is one embodiment, but it is not restricted to this one. A numeral appended to each of logic gates at the respective stage represents the number of decoder components. A reference F.O (fan out) and a numeral appended thereto represent the number of circuits. As clearly be understood from FIG. 2, each wiring including a lot of logic gates is connected to one input buffer 3. Thus, a floating electrostatic capacity C and a resistance R of the wiring becomes a load imposed to one input buffer 3. If a time constant T with the load becomes larger, a waveform of a signal is skewed, which results in a delay of time.

Thus, according to the present invention, the length of the signal pass from the input buffer 3 to the remotest decoder 6C at the final stage or memory cell can be shortened not more than a total length of the shorter and longer sides of the chip at the longest. Because, the group of the memory cell blocks 2A to 2D to which processing signals of the input buffer 3 are transmitted, are equally divided into two sections, and the input buffer 3 is provided in the passway between the memory cell blocks 2C and 2D disposed symmetrically with respect to the division line or nearmost the same. In this connection, when the input buffer 3 is located at the corner or peripheral portion of the chip similarly to the prior art, the length of the signal pass becomes longer by half of the length of the longer side of the chip relative to the above-mentioned embodiment of the invention.

According to the embodiment, the logic gate 6A at the primary stage of the decoder device can be provided in the vicinity of the input buffer 3 and the logic gate 6B at the second stage can also be located in the vicinity of the primary stage logic gate 6A, so that a wiring length of the decoder device 6 can be reduce.

As a result, because a time constant of a signal transmission circuit from the input buffer 3 to the memory cell or logic gate 6C at the final stage is reduced, the present invention makes it possible to minimize transmission lag of the signals at the rate of the reduction of the time constant.

It is needless to say that the decoder device 6 may be constituted at any number of stages, and it is not exclusive to the three stages.

The input buffer 3 is located at the intermediate region of the memory cell block group even if the memory cell blocks are locally disposed at any position of the chip. The locating position of the input buffer 3 may be out of the central portion of the chip, owing to the location of the memory cell blocks.

Figure 3:
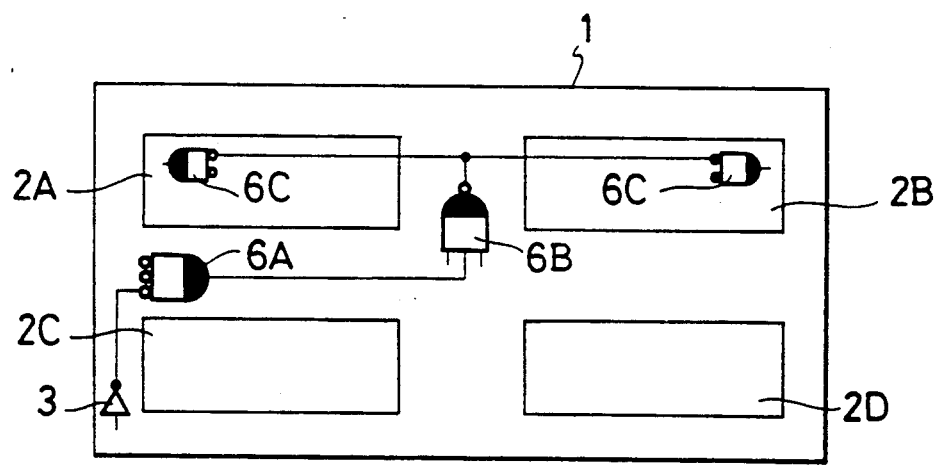
FIG. 3 is an explanatory view showing a disposition of a semiconductor memory according to the prior art.

Comparing by a simulation the effect of the shortening of the delay time in the embodiment of the invention, such as in FIG. 1, and that of the conventional input buffer arrangement as shown in FIG. 3, the delay time of this embodiment was 2.4 nano-second, whereas the delay time of the conventional instance was 2.7 nano-second. It was confirmed that there was an effect of shortening the delay time by 0.3 nano-second in this embodiment. The shortening of the delay time thus results in shortening memory access time. The above delay time was derived between an output of the input buffer 3 to an output of the decoder device 6, provided that a half value of the height of the signal voltage waveform was regarded as a threshold level.

Figure 4:
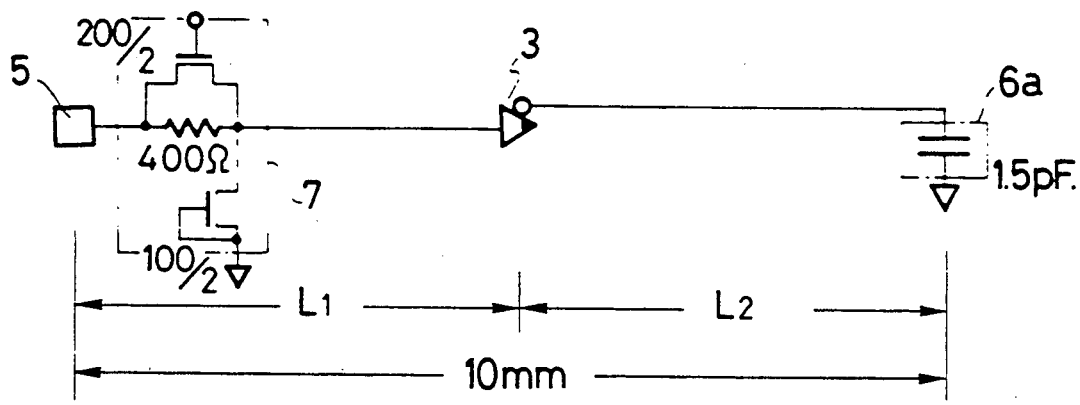
FIG. 4 is a diagram of an equivalent circuit of a signal transmission circuit from input pads to a primary stage decoder.
Figure 5:
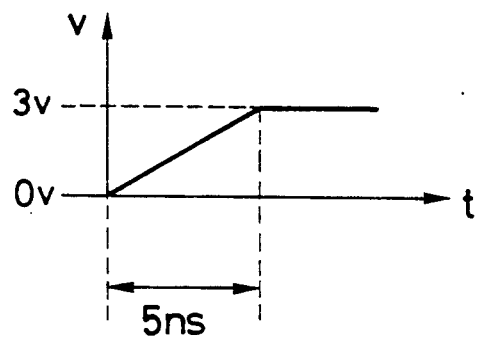
FIG. 5 is a diagram of a waveform of an external signal input into the input pads.
Figure 6:
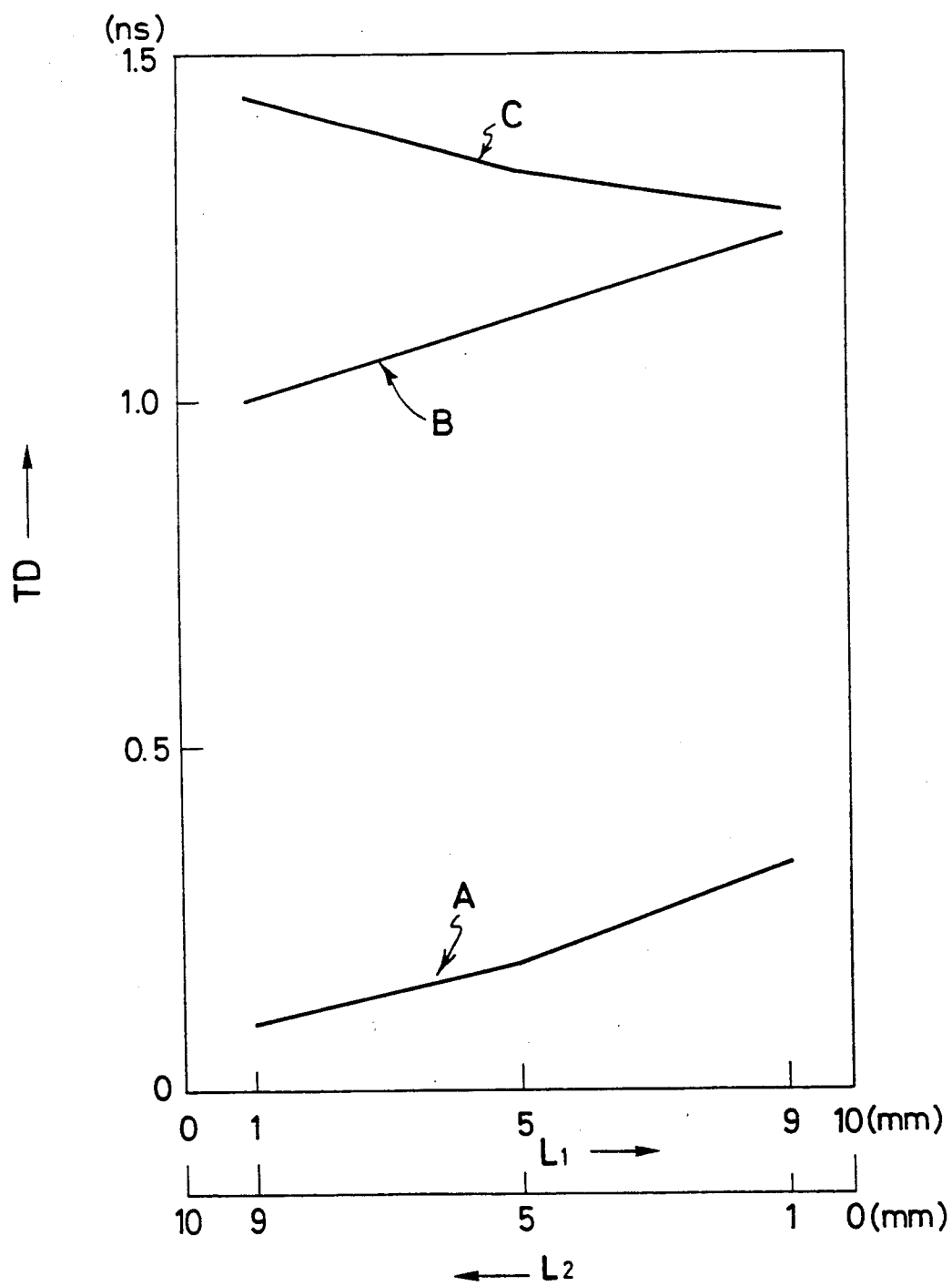
FIG. 6 is a diagram showing a simulation effect of delay times of transmitting the signal at respective portions from the input pads to input terminals of an input buffer, the input pads to output terminals of the input buffer, and the input pads to the primary stage decoder, when the position of the input buffer in FIG. 5 is changed.

With reference to FIGS. 4, 5 and 6, a simulation result will be explained in regard to the shortening of transmission lag of signals from the input pads 5 to the decoder primary stage 6A, while locating the input buffer 3 at the same position as the above-described first embodiment. In this simulation, a distance from the input pads 5 to the decoder primary stage 6A was, for example, 10 mm and the input buffer 3 was disposed at the intermediate portion between the input pads and the decoder primary stage. It was assumed that the input load of the decoder primary stage 6A was 1.5 pF, and that an aluminum alloy lief of 3 $\mu$m width was used as a wiring material. An input guard element 7 is provided on each input pad 5. The input guard element 7 is comprised two MOSFETs and a resistance. The resistance is connected in parallel with the first MOSFET inserted a signal line. A gate of the second MOSFET is connected to a chathode line. Then this MOSFET is to be a diode. The input guard element 7 is an element for absorbing a noise and includes a characteristic, and when an control voltage larger than a prescribed voltage is input to a control gate of the first MOSFET, the resistance value of the input guard element 7 is dynamically decreased. Now, a distance from the input pad 5 to the input buffer 3 is referred to as L1 and a distance from the input buffer 3 to the decoder primary stage 6A is as L2. In this case, L1 plus L2 equals to 10 mm. A rising edge waveform of a pulse of the external signal input from the input pad 5 was skewed as shown in FIG. 5.

A result obtained by simulating transmission lag of the signals at the respective portions under these conditions when values of L1 and L2 are changed, is illustrated in FIG. 6. An ordinate of FIG. 6 designates a transmission lag time TD from the input pad 5 and an abscissa thereof designates L1 or L2. Lines !, B and C in the drawing show a signal delay time from the input pad 5 to an input terminal of the input buffer 3, a signal delay time from the input pad 5 to an output terminal of the input buffer 3 and a signal delay time from the input pad 5 to an input terminal of the decoder primary stage 6A, respectively. As be clearly understood form FIG. 6, as the length of L1 was elongated and the length of L2 was shortened, the transmission lag was reduced. This tendency becomes more remarkable as the input load of the decoder 6 becomes larger.

As mentioned so far, according to the first embodiment, since the input buffer 3 is located in the intermediate area in a group of the memory cell blocks 2A to 2D to thereby shorten a length of a signal pass from the input buffer 3 to each memory cell, the resistance and the floating electrostatic capacity of the wiring on the downstream of the input buffer 3 are decreased so that the time constant is also reduced. Accordingly, because the pulse including a steep rising edge and falling edge of which waveform is shaped through the input buffer 3 is transmitted, with the skew of the rising edge and the falling edge being reduced, the memory cell or the logic gate which operates at a certain threshold level is to operate after a short time of delay. As a result, the transmission time of the signal from the input pad 5 to the memory cell can be remarkably shortened, thereby making it possible to realize a high-speed memory access. Further, is the input pad 5 is provided in the area adjacent to the input buffer 3 within the edge region of the semiconductor chip, the length of the signal pass from the input pad 5 to the input buffer 3 is reduced, so that the transmission time of the signal can be further shortened.

Such shortening of the transmission time brings a possibility of an increase in the number of logic gate stages of the address decoder device 6, whereby a degree of freedom in designing a system or layout of the address decoder device 6 and the memory cell blocks 2 is enlarged. Further, since the input buffer 3 is not provided in the edge region of the semiconductor chip, a degree of freedom in designing a layout of the input pads 5 is enlarged, the location of the input pads 5 being restricted to the edge region of the chip. In particular, there is a large practical merit when the number of input/output signals is increased because of a large scale of the memory. Also, there occurs a possibility of reducing an installation area occupied by the chip.

FIGS. 7 to 15 show further embodiments in regard to arrangements of input buffers 3 and input pads 5. In the case where all the input buffers 3 cannot be located between a pair of memory cell blocks owing to a restriction in an overall arrangement design, as representatively explaining by these embodiments, the input buffers are provided in other areas which exist along the bisector and between the cell blocks. In this way, the same effect as in the embodiment of FIG. 1 can be obtained.

The disposition of the input pads 5 can be determined on the basis of a relationship with the overall constitution of the chip including the disposition of input terminals.

Additionally, as for a mutual positional relationship between the input pads 5 and the input buffers 3, it is desirable to dispose a pair of the corresponding input pad and input buffer in adjacent to each other in view of shortening a period of time of transmitting signals.

Figure 7:
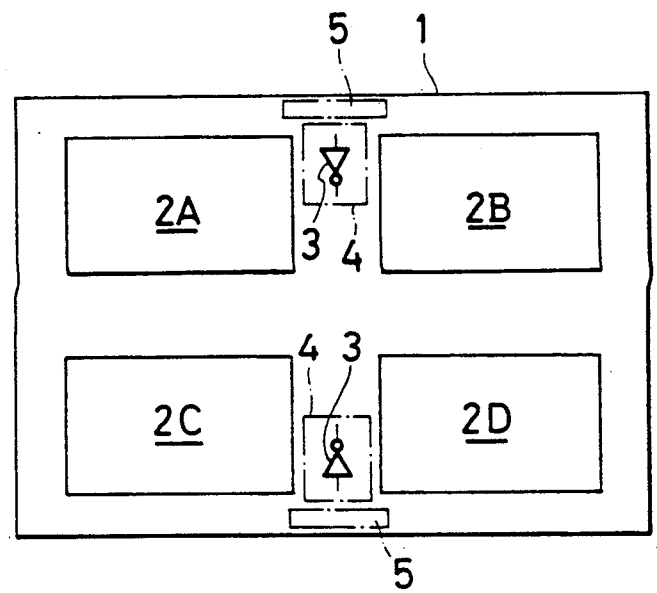
FIGS. 7 to 15 are explanatory views showing the dispositions of further embodiments of the semiconductor memory according to the invention.
Figure 8:
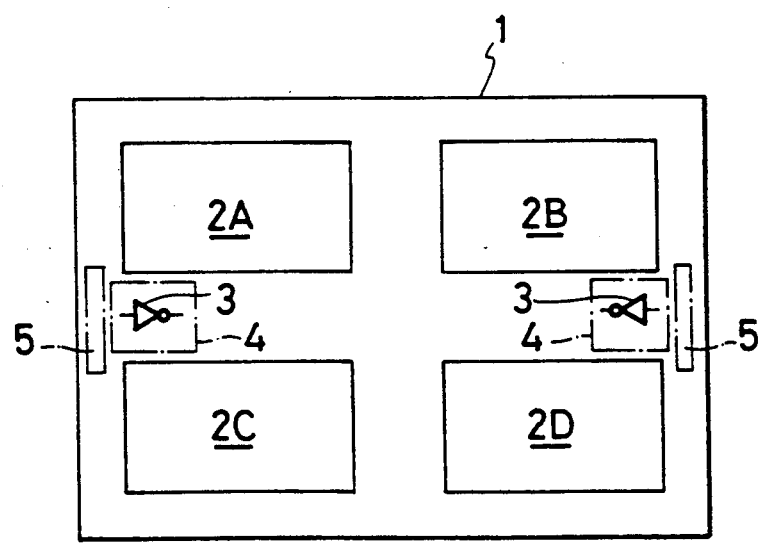
Figure 9:
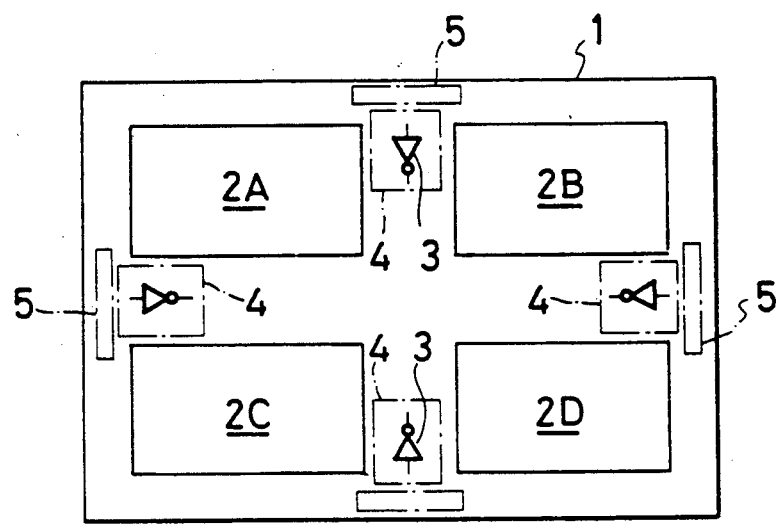
Figure 10:
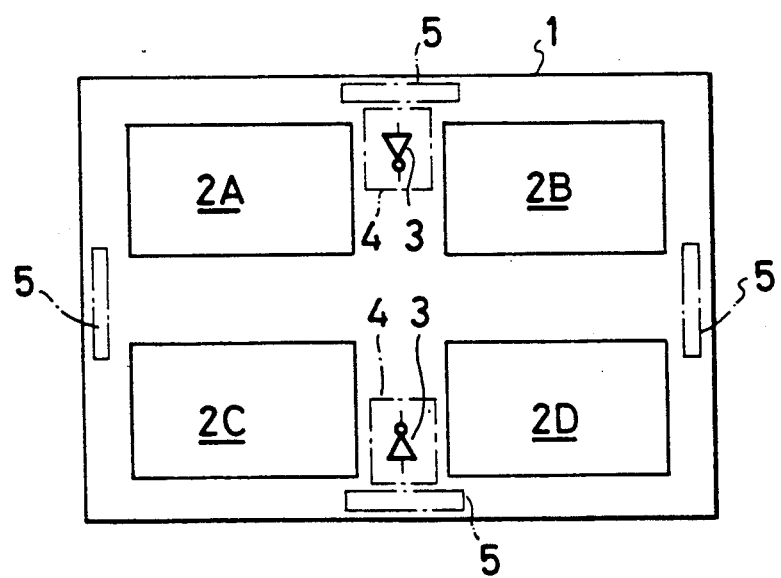
Figure 11:
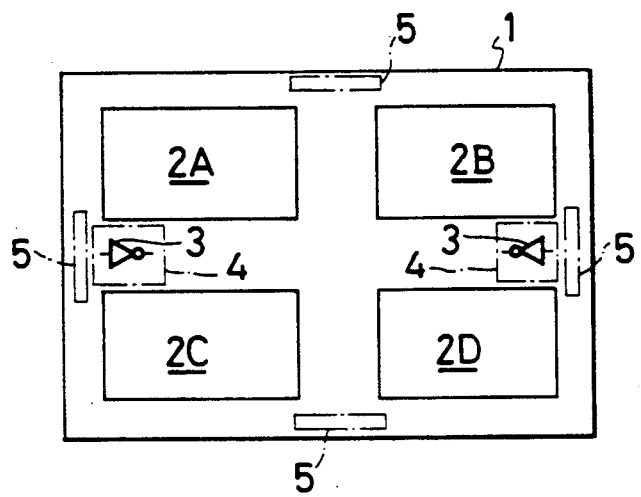
Figure 12:
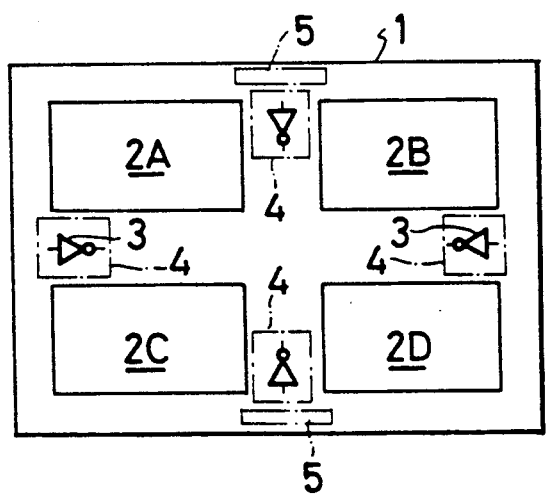
Figure 13:
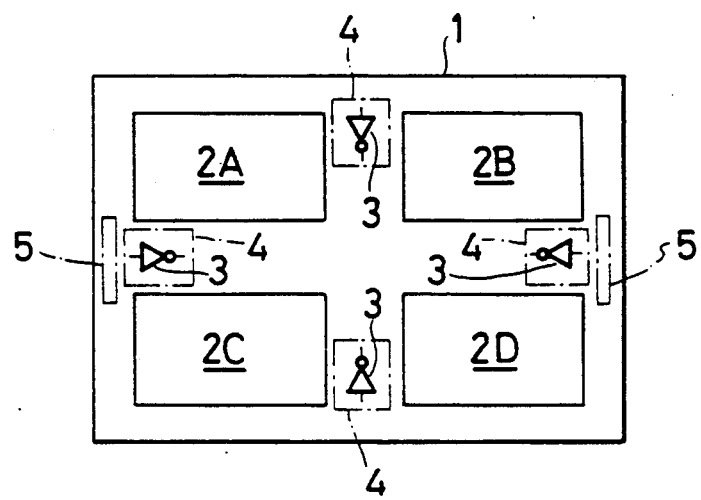
Figure 14:
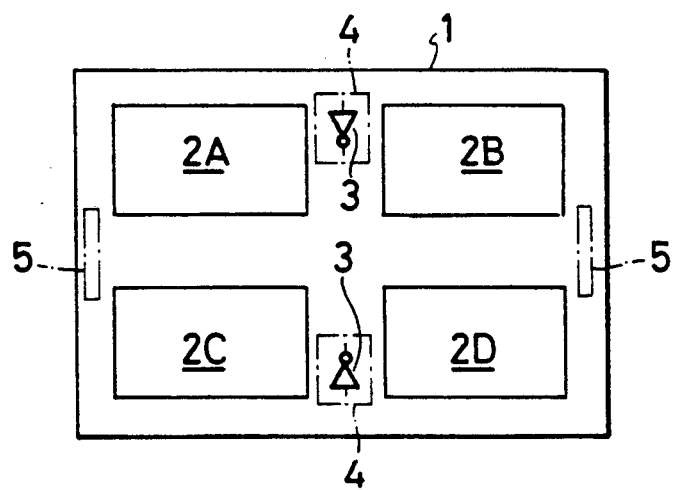
Figure 15:
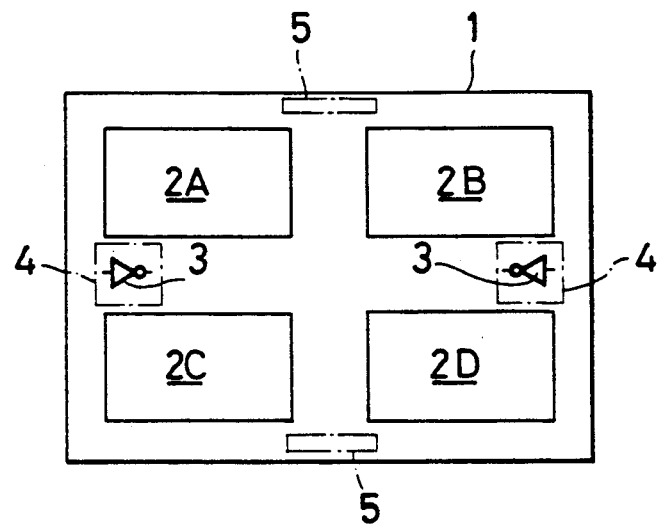

There is shown in FIGS. 7, 10 and 14, one embodiment in which when primary stage decoders 6A are respectively provided between memory cell blocks 2A and 2B, and 2C and 2D, input buffers 3 are disposed at the two position corresponding to the respective primary stage decoders. This embodiment is advantage out because periods of signal transmitting time from the respective primary stage decoders to the corresponding memory cell blocks can be shortened. In FIGS. 10 and 14, some or all input pads 5 are provided at positions remote from the input buffers 3 since they are restricted by a space of the edge region of the chip. As mentioned above, however, the delay time from the input pads 5 to the input buffers 3 is permissible because it is very short on the whole. FIGS. 8, 11 and 15 illustrate some instances in which primary stage decoders 6A are respectively located between memory cell blocks 2A and 2C, and 2B and 2D. In other embodiments in FIGS. 9 and 12, input buffers 3 are respectively provided in four passways between memory cell blocks 2A and 2B, 2B and 2D, 2D and 2C, and 2C and 2A, which embodiments are optimum when the primary stage decoder 6A is located in the central portion of the memory cell block group. According to these embodiment, each period of transmission time of the signal from the primary stage decoder to each memory cell block can be equalized and minimized.

Figure 16:
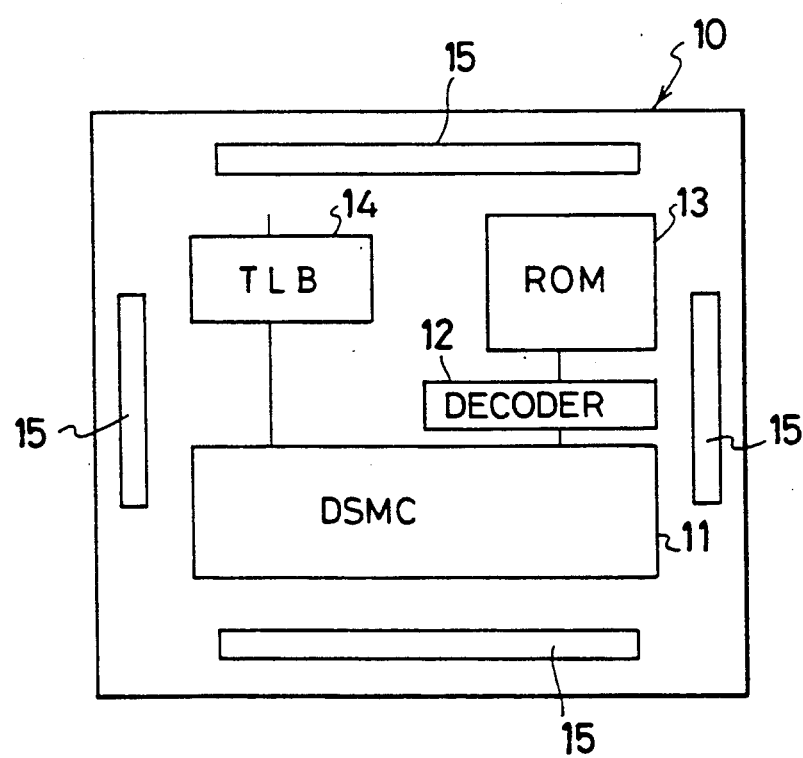
FIG. 16 is a block diagram of one embodiment of a microprocessor of the invention.

FIG. 16 is a block diagram of one embodiment of a microprocessor according to the present invention. In this embodiment, the technical matter of the above-described semiconductor memory may be applied to a ROM of the microprocessor. Referring to this figure, the micro-processor 10 comprises a DSMC (Data Structure Macro Cell) 11, a decoder 12, a ROM 13, a TLB (Transistor Lookaside Buffer) 14, and a plurality of input/output pads 15, these being mounted on a semiconductor chip. The ROM 13 has a function to decode commands or control signals. The decoder 12 receives data output from the ROM 13 so as to decode them into signals for arithmetic. The DSMC 11 receives the decoded signals for arithmetic and carries out various kinds of arithmetic processings. The TLB 14 serves to convert logic addresses resulted from the processing of the DSMC 11 into physical address such as memory address. A memory array of the ROM 13 of this embodiment is divided into a plurality of memory cell blocks, similarly to the embodiment of FIG. 1. External signals input from the decoder 12 are directly introduced into an input buffer without passing through the input pads, and are transmitted to the memory cell directly or via an address decoder. This input buffer is provided in an intermediate area in the memory cell block group to which the signals are transmitted, as in the above-mentioned embodiments.

In the microprocessor 10 of this embodiment, since memory access is executed at a high speed, a processing speed of the microprocessor is also increased. Resulting from increasing the speed of the memory access, a degree of freedom in designing systems of the decoder 12 and the DSMC 11 is increased at the same processing speed. This brings a possibility that a microprocessor with a processing system to meet the user's requisite specification can be provided.

In addition, though the semiconductor memory of the present invention can be applied to the ROM of the microprocessor in the embodiment shown in FIG. 16, it is similarly applicable to a RAM of a microprocessor.

What is claimed is:
1. A semiconductor memory including:
    a rectangular semiconductor chip;
    a plurality of memory cell blocks formed with a plurality of memory cells disposed in alignment within a plurality of rectangular areas on the upper surface of said semiconductor chip, which are arrayed to be disposed in alignment spaced apart from one another with passways being interposed between the adjacent areas;
    a plurality of input pads formed in the peripheral region on the upper surface of said semiconductor chip; and
    at least one input buffer provided on the upper surface of said semiconductor chip, and processing an external signal which is input from one of said input pads, and the processed signal being transmitted to the memory cell in the memory cell block group including at least two said memory cell blocks directly or via a logic circuit:

wherein said input buffer is provided in one of said passways, which is the closest to a line for equally dividing said memory cell block group longitudinally or laterally into two sections, said passway interposing between the adjacent memory cell blocks belonging to said memory cell block group to which the processed signal of said input buffer is transmitted.

2. The semiconductor memory according to claim 1, wherein the external signal input into said input buffer is one of signals such as address signals, write enable signals, write data and address strobe signals.

3. The semiconductor memory according to claim 1, wherein the external signal input into said input buffer is an address signal, said logic circuit is an address decoder whose logic element at least a primary stage is disposed in said passway where said input buffer is provided.

4. The semiconductor memory according to claim 1, wherein said input pads are located in a portion adjacent to said passway where said input buffer is provided, within the peripheral region of said semiconductor chip.

5. The semiconductor memory according to claim 2, wherein said input pads are located in a portion adjacent to said passway where said input buffer is provided, within the peripheral region of said semiconductor chip.

6. The semiconductor memory according to claim 3, wherein said input pads are located in a portion adjacent to said passway where said input buffer is provided, within the peripheral region of said semiconductor chip.

7. A microprocessor comprising:
a central processing unit and a memory which are formed on the upper surface of a semiconductor chip;

said memory including a plurality of memory cell blocks formed with a plurality of memory cells disposed in alignment within a plurality of rectangular areas on the upper surface of said semiconductor chip, which are arrayed to be disposed in alignment apart from one another with passways being interposed between the adjacent areas, and at least one input buffer, said input buffer being adapted to process an external signal which is input from said central processing unit so as to transmit the processed signal to the memory cells of a memory cell block group including at least two said memory cell blocks directly or via a logic circuit:

wherein said input buffer is provided in one of said passways, which is the closest to a line for equally dividing said memory cell block group longitudinally or laterally into two sections, said passway interposing between the adjacent memory cell blocks belonging to said memory cell block group to which the processed signal of said input buffer is transmitted.

8. The microprocessor according to claim 7, wherein the external signal input into said input buffer is one of signals such as address signals, write enable signals, write data and address strobe signals.

9. The microprocessor according to claim 7, wherein the external signal input into said input buffer is an address signal, said logic circuit is an address decoder whose logic element at least a primary stage is disposed in said passway where said input buffer is provided.

* * * * *